United States Patent
Ausserlechner

(10) Patent No.: US 11,131,726 B2
(45) Date of Patent: Sep. 28, 2021

(54) APPARATUS AND METHOD USING A PLURALITY OF MAGNETIC FIELD SENSITIVE DEVICES COUPLED SUCH THAT MULTIPLE CURRENTS FLOW THROUGH AT LEAST ONE OF THE MAGNETIC FIELD SENSITIVE DEVICES

(71) Applicant: Infineon Technologies AG, Neubiberg (DE)

(72) Inventor: Udo Ausserlechner, Villach (AT)

(73) Assignee: Infineon Technologies AG

( * ) Notice: Subject to any disclaimer, the term of this patent is extended or adjusted under 35 U.S.C. 154(b) by 0 days.

(21) Appl. No.: 16/823,661

(22) Filed: Mar. 19, 2020

(65) Prior Publication Data

US 2020/0217906 A1  Jul. 9, 2020

Related U.S. Application Data

(62) Division of application No. 15/633,976, filed on Jun. 27, 2017, now Pat. No. 10,620,278.

(30) Foreign Application Priority Data

Jun. 30, 2016 (DE) .................... 10 2016 211 964.8

(51) Int. Cl.
  *G01R 33/09* (2006.01)
  *G01R 33/00* (2006.01)
(52) U.S. Cl.
  CPC ......... *G01R 33/09* (2013.01); *G01R 33/0017* (2013.01); *G01R 33/0094* (2013.01)

(58) Field of Classification Search
  CPC ........... G01R 33/0017; G01R 33/0094; G01R 33/09
  See application file for complete search history.

(56) References Cited

U.S. PATENT DOCUMENTS

| | | | | |
|---|---|---|---|---|
| 2014/0028304 A1* | 1/2014 | Ausserlechner | ....... | G01R 19/25 324/251 |
| 2016/0124055 A1* | 5/2016 | Ausserlechner | ..... | G01R 33/075 324/251 |

* cited by examiner

*Primary Examiner* — Jay Patidar
(74) *Attorney, Agent, or Firm* — Design IP

(57) ABSTRACT

An apparatus for magnetic field detection includes a power supply and a plurality of magnetic field sensitive devices including at least first, second, and third magnetic field sensitive devices. The first to third magnetic field sensitive devices are coupled to each other and to the power supply such that a first supply current path runs through the first magnetic field sensitive device and not through the second magnetic field sensitive device, a second supply current path runs through the second magnetic field sensitive device and not through the first magnetic field sensitive device, and the first and second current paths run through the third magnetic field sensitive device. An internal resistance of the third magnetic field sensitive device is smaller than both an internal resistance of the first magnetic field sensitive device and an internal resistance of the second magnetic field sensitive device.

11 Claims, 9 Drawing Sheets

APPARATUS AND METHOD USING A PLURALITY OF MAGNETIC FIELD SENSITIVE DEVICES COUPLED SUCH THAT MULTIPLE CURRENTS FLOW THROUGH AT LEAST ONE OF THE MAGNETIC FIELD SENSITIVE DEVICES

CROSS-REFERENCE TO RELATED APPLICATIONS

This application is a divisional of U.S. patent application Ser. No. 15/633,976 filed Jun. 27, 2017, which claims the benefit of German Patent Application No. 10 2016 211 964.8 filed Jun. 30, 2016, which are incorporated by reference as if fully set forth.

FIELD

The present disclosure relates to apparatuses and methods which use a plurality of magnetic field sensitive devices.

BACKGROUND

Magnetic field sensitive devices are used to measure magnetic fields. Examples of magnetic field sensitive devices are Hall effect devices. Hall effect devices have an output signal proportional to the magnetic field. At a magnetic field of zero, magnetic field sensitive devices may output a signal which is different from zero. This signal is called the offset error (=zero field error) of the device.

Hall effect devices comprise a Hall effect region where the Hall effect takes place, which is sometimes called active region, and which is provided with three or more contacts. Generally, the Hall effect region is formed of a semiconducting material in a semiconductor substrate. A contact may be formed by a contact tub located in or in touch with the Hall effect region. A contact may be made by a contact diffusion or an implantation process. Several contacts may be connected via metal lines to the same terminal, such as in an interconnect layer of the semiconductor technology. Terminals are used to supply the device with electric power and to tap its output signals.

Hall plates (sometimes called Horizontal Halls (HHalls)) are flat devices and may have thicknesses 5 to 10000 (typically 50) times smaller than their lateral size. They are used to detect magnetic field components along their thickness direction (i.e. direction into the semiconductor substrate). In silicon technology, Hall plates are typically 1 to 3 µm thick and 10 to 100 µm large in lateral directions. Their layout can be rectangular, square, circular, octagonal, cross-shaped, or even triangular.

Vertical Hall effect devices (VHalls) are stout devices in which one of the lateral dimensions is comparable (0.2 times up to 10 times) to their dimension in the thickness direction (i.e. direction into the semiconductor substrate). VHalls often have the shape of long stripes, mostly straight, sometimes curved, arc-shaped, or even circular ring shaped. VHalls are used to detect magnetic field components parallel to the semiconductor main surface.

Hall effect devices with four terminals may be operated in a spinning current operation, where, in a first operating phase, current is sent through a first pair of terminals and voltage is tapped at a second pair of contacts, and, in a second operating phase, the first and second pairs of terminals are swapped and finally the voltages of both operating phases are combined (added or subtracted) to a total signal. The zero field error of this total or overall signal may be called residual offset. Expressed relative to the magnetic field (equivalent magnetic field) it may be about 500 times smaller than in each individual operating phase.

Several Hall effect devices comprising three terminals are known and an offset cancellation operation for a series connection of several Hall effect devices comprising three terminals has been described. The offset cancellation operation includes a number of operating phases, wherein coupling of the contacts of the Hall effect devices to the terminals is different in different operating phases. The output signals obtained in all operating phases are combined into a total signal and the offset in the total signal is also called residual offset.

The residual offset generally depends on the supply voltage at which the device is operated. With larger supply voltages the residual offset grows. This is caused by a self-heating and an electrical non-linearity of the devices, wherein these effects are larger at larger supply voltages. In order to achieve a low residual offset the devices may be operated at a low supply voltage of e.g. 0.5V (instead of larger supply voltages of 2 . . . 3V). However, sensor circuits and sensor control circuits often operate at supply voltages of 3 to 5V. A bias circuit may be provided to control the supply voltage. By using a bias circuit, the control circuit may waste a lot of voltage. If the external supply voltage is 3V and the Hall effect device is operated at 0.5V, the control circuit wastes 2.5V, which is 5 times the power of the Hall effect device. In such a case, the power efficiency of the sensor is only a sixth.

A vertical Hall sensor with series-connected Hall effect regions has been described, in which current flows through several devices in series. Thus, each device is operated at a lower supply voltage and this may result in a better residual offset. For devices with four terminals this is straightforward, however, for devices with three terminals this is not straightforward.

SUMMARY

Examples of the present disclosure provide an apparatus comprising a plurality of magnetic field sensitive devices comprising at least a first magnetic field sensitive device, a second magnetic field sensitive device and a third magnetic field sensitive device, and a power source configured to provide a first supply current through the first magnetic field sensitive device and a second supply current independent of the first supply current through the second magnetic field sensitive device. The first to third magnetic field sensitive devices are coupled such that the first supply current flows through the first magnetic field sensitive device and not through the second magnetic field sensitive device, the second supply current flows through the second magnetic field sensitive device and not through the first magnetic field sensitive device, and a sum of first supply current and the second supply current flows through the third magnetic field sensitive device.

Examples of the present disclosure provide an apparatus comprising a plurality of magnetic field sensitive devices comprising at least a first magnetic field sensitive device, a second magnetic field sensitive device and a third magnetic field sensitive device, and a power supply. The first to third magnetic field sensitive devices are coupled to each other and to the power supply such that a first supply current path runs through the first magnetic field sensitive device and not through the second magnetic field sensitive device, a second supply current path flows through the second magnetic field sensitive device and not through the first magnetic field sensitive device, and the first and second current paths run through the third magnetic field sensitive device. The internal resistance which the third magnetic field sensitive device provides to a supply current is smaller than the internal resistance which the first magnetic field sensitive device provides to a supply current and which the second magnetic field sensitive device provides to a supply current.

Examples of the present disclosure provide a method for detecting a magnetic field using an apparatus comprising a plurality of magnetic field sensitive devices having at least three terminals and grouped in N groups, with N>1, wherein each group k comprises $2^{k-1}$ magnetic field sensitive devices, for 1≤k≤N, wherein k and N are natural numbers, wherein the plurality of magnetic field sensitive devices are coupled such that, for 1<k≤N, supply currents flowing through two magnetic field sensitive devices in group k flow through one magnetic field sensitive device in group k−1. The method comprises independently providing a supply current through each magnetic field sensitive device of group N, tapping an output voltage at at least one contact of at least one magnetic field sensitive device of each group, and combining the tapped output signals to an overall output signal representing a measure of the magnetic field.

BRIEF DESCRIPTION OF THE DRAWINGS

Examples of the disclosure will be described using the accompanying drawings, in which.

DETAILED DESCRIPTION

In the following, examples of the present disclosure will be described in detail using the accompanying drawings. It is to be pointed out that the same elements or elements having the same functionality are provided with the same or similar references numbers and that a repeated description of elements provided with the same or similar reference numbers is typically omitted. Hence, descriptions provided for elements having the same or similar reference numbers are mutually exchangeable. In the following description, a plurality of details is set forth to provide a more thorough explanation of examples of the disclosure. However, it will be apparent to one skilled in the art that other examples may be practiced without these specific details. In other instances, well-known structures and devices are shown in block diagram form rather than in detail in order to avoid obscuring examples described herein. In addition, features of the different examples described hereinafter may be combined with each other, unless specifically noted otherwise.

Figure 1:
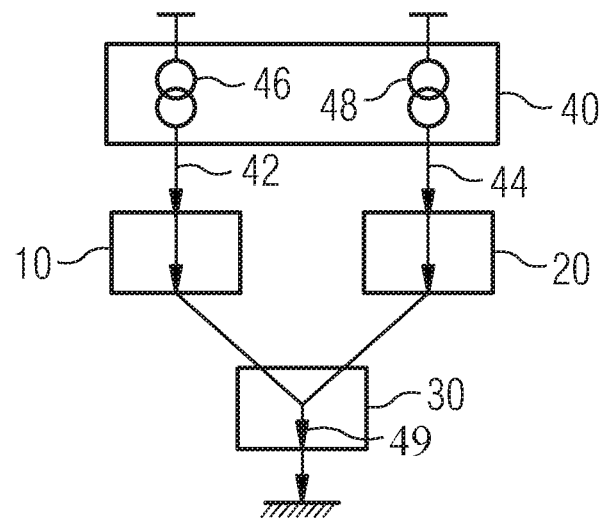
FIG. 1 shows a schematic view of an example of an apparatus comprising first to third magnetic field sensitive devices.

FIG. 1 shows an example of an apparatus for detecting a magnetic field, which comprises a first magnetic field sensitive device 10, a second magnetic field sensitive device 20, and a third magnetic field sensitive device 30. The apparatus comprises a power source 40 which is configured to provide a first supply current 42 through the first magnetic field sensitive device 10 and to provide a second supply current which is independent of the first supply current through the second magnetic field sensitive device 20. The magnetic field sensitive devices 10, 20 and 30 are coupled so that the first supply current 42 flows through the first magnetic field sensitive device 10 and not through the second magnetic field sensitive device 20, so that the second supply current 44 flows through the second magnetic field sensitive device 20 and not through the first magnetic field sensitive device 10, and so that a sum of the first supply current 42 and the second supply current 44 flows through the third magnetic field sensitive device 30.

For example, a first supply terminal of the first magnetic field sensitive device 10 may be coupled to the power source 40, a first supply terminal of the second magnetic field sensitive device 20 may be coupled to the power source 40, a second supply terminal of the first magnetic field sensitive device 10 may be coupled to a first supply terminal of the third magnetic field sensitive device 30, a second supply terminal of the second magnetic field sensitive device 20 may be coupled to a second supply terminal of the third magnetic field sensitive device 30, and a third supply terminal of the third magnetic field sensitive device 30 may be coupled to a reference potential, such as ground.

The power source 40 is configured to provide the first and second supply currents 42, 44 independent of each other. In examples, the power source may be configured to impress the respective supply currents through the respective magnetic field sensitive device. In other words, the power source is configured to force a specific amount of current through each device, wherein the specific amount is defined exactly by the power source irrespective of the device. In examples, the power source may include a first current source 46 to provide the first supply current 42 and a second current source 48 to provide the second supply current 44. The supply currents 42 and 44 may have the same direction and may have an identical magnitude.

In examples of the present disclosure, each of the plurality of magnetic field sensitive devices may include at least three terminals, wherein at least two of the terminals are used as supply terminals and at least one of the terminals is used as an output terminal for tapping an output signal. An output signal which depends on a magnetic field acting on the magnetic field sensitive device is tapped at the output terminal or the output terminals. In examples of the present disclosure, three terminals of each magnetic field sensitive device are used as supply terminals and two of the three terminals used as supply terminals are also used as output terminals.

Figure 2:
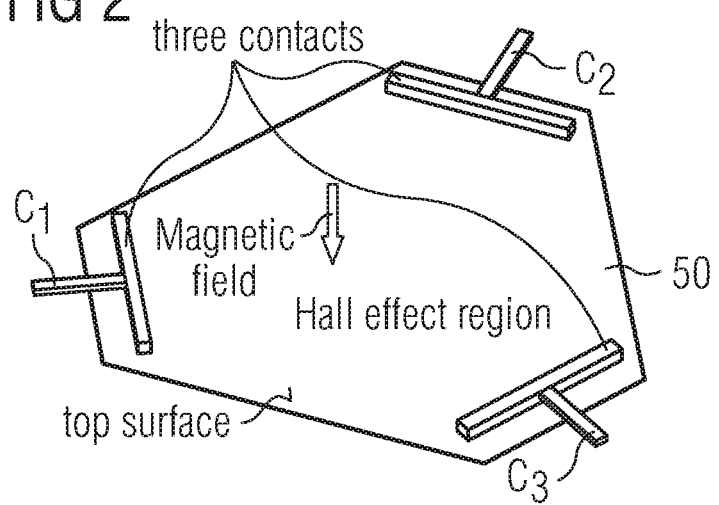
FIG. 2 shows a schematic view of a HHall effect device having three contacts.
Figure 3:
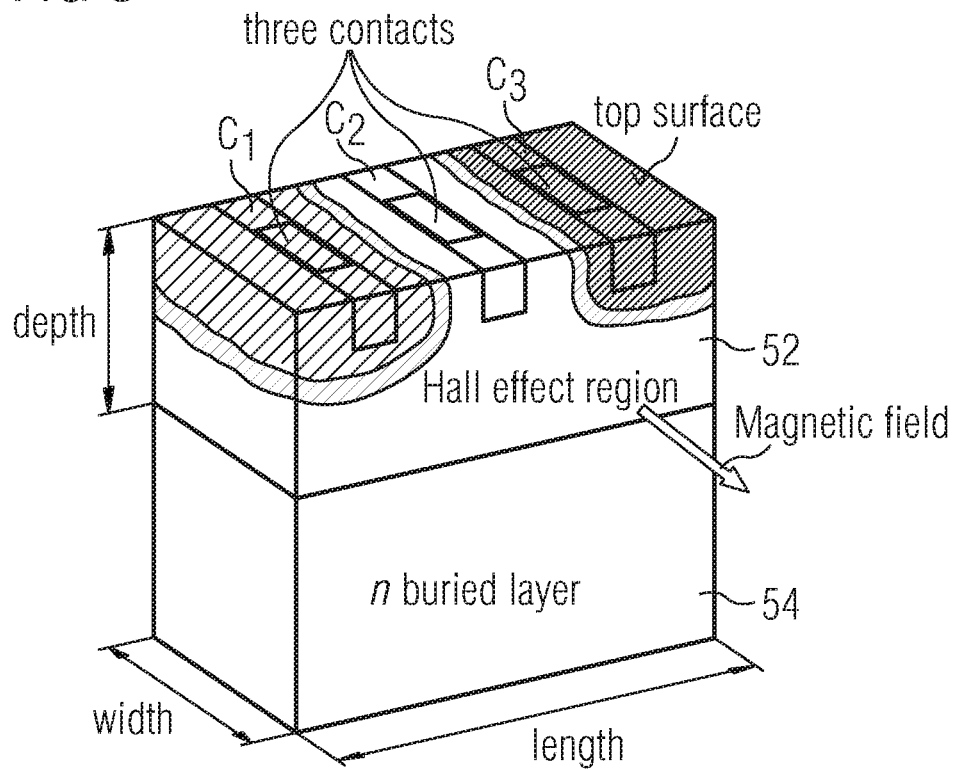
FIG. 3 shows a schematic view of a VHall effect device having three contacts.

In examples of the present disclosure, the magnetic field sensitive devices are Hall effect devices, such as those described in the background above. Examples of Hall effect devices are shown in FIGS. 2 and 3. FIG. 2 shows an example of a horizontal Hall effect device (Hall plate) with three contacts $C_1$, $C_2$, $C_3$ formed in or on a surface (such as the top surface) of an active Hall effect region 50. The Hall plate shown in FIG. 2 is 120° symmetric. FIG. 3 shows an example of an asymmetrical vertical Hall effect device comprising three contacts $C_1$, $C_2$ and $C_3$ in or on the surface (such as the top surface) of an active Hall effect region 52. The example of the vertical Hall effect device shown in FIG. 3 may be formed in BiCMOS technology with a buried layer 54. Indicated in FIG. 3 are the dimensions, i.e. the length, the width and the depth of the active Hall effect region 52. The length of the Hall effect region may be about 10 μm and the width and the depth may be about 5 μm each. In other examples, the vertical Hall effect device may be implemented in CMOS technology without the buried layer 54. It is to be noted that the present disclosure is not restricted to the Hall effect devices described but can be implemented with other magnetic field sensitive devices as well.

Figure 4:
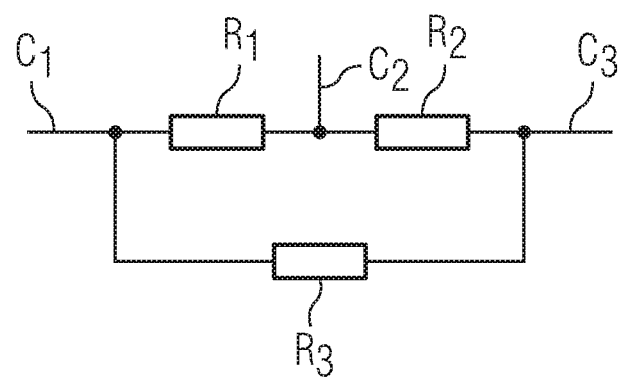
FIG. 4 shows an equivalent circuit diagram for a Hall effect device having three contacts.

The equivalent circuit of a Hall effect device having three contacts at zero magnetic field is shown in FIG. 4. There is an internal resistance $R_1$ between contacts $C_1$ and $C_2$, an internal resistance $R_2$ between contacts $C_2$ and $C_3$ and an internal resistance $R_3$ between contacts $C_1$ and $C_3$.

Figure 5:
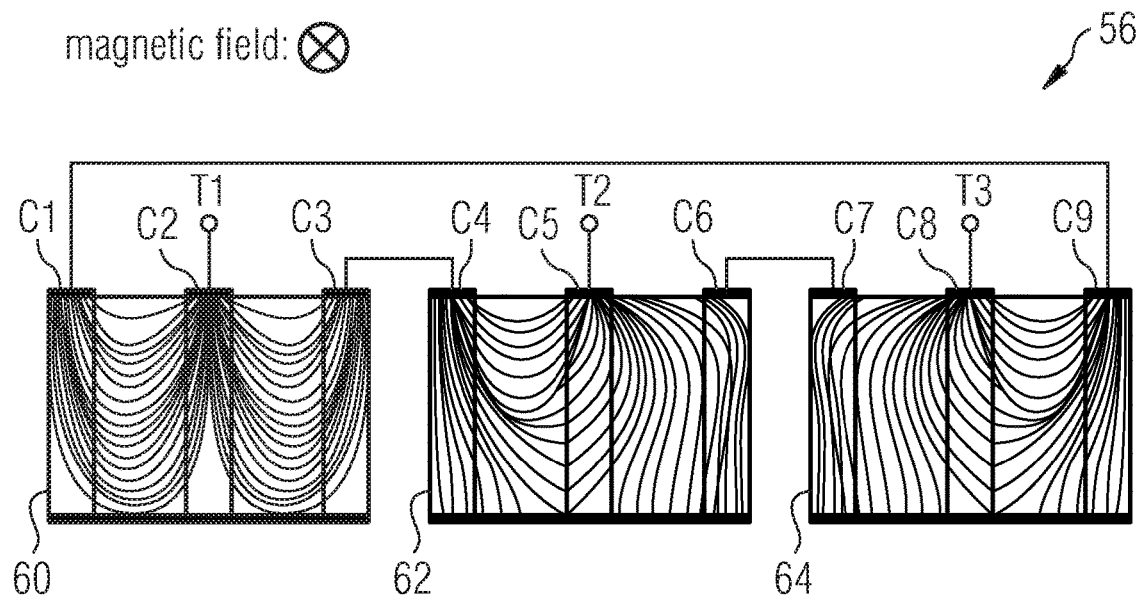
FIG. 5 shows a series connection of VHall elements.
Figure 6:
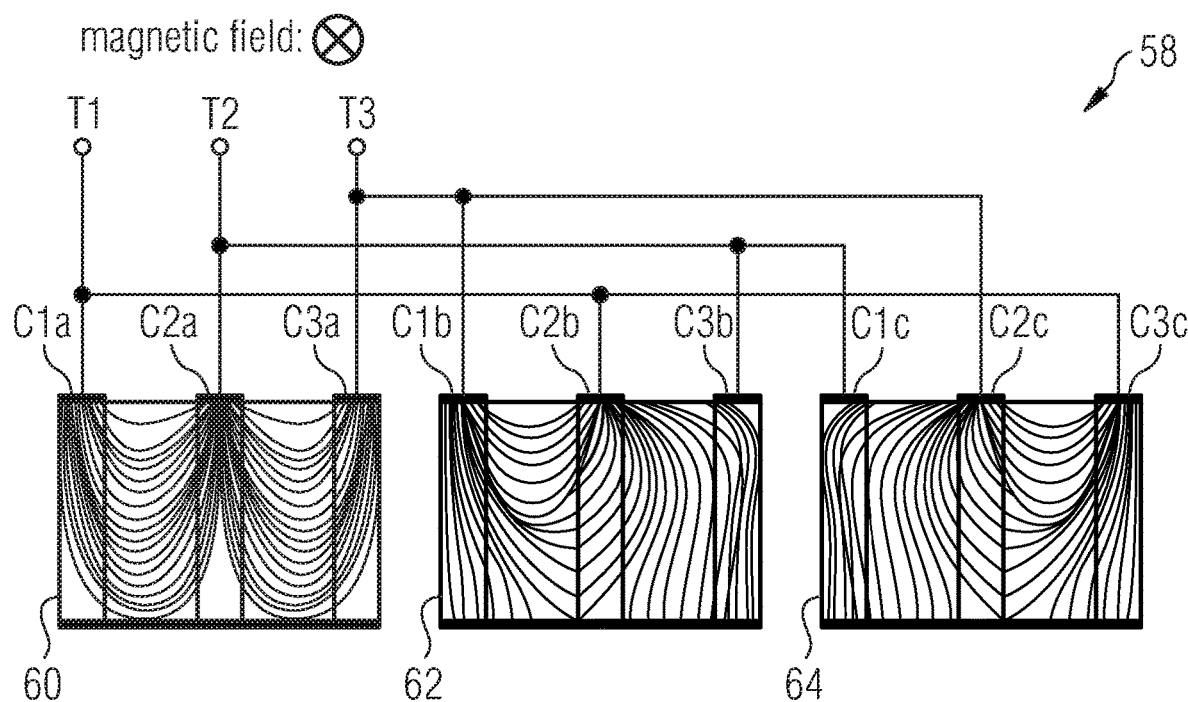
FIG. 6 shows a parallel connection of VHall elements.

FIGS. 5 and 6 show two different possibilities how three electrically asymmetric VHalls can be connected together with wires to get an electrically symmetric overall magnetic field sensitive device, which has an equal resistance between any two of its three terminals T1, T2, T3 and an identical magnetic sensitivity at any terminal if current flows in and out of the other two terminals. FIGS. 5 and 6 show cross sections of the devices, where the size of each device in the horizontal direction is its length and in the vertical direction is its depth. FIG. 5 shows a magnetic field sensitive device 56 comprising three disjunct Hall elements (Hall tubs) 60, 62, 64, the contacts $C_1$, $C_2$, $C_3$ of which are connected to the terminals T1, T2 and T3 so that the Hall elements are connected in series. FIG. 6 shows a magnetic field sensitive device 58 comprising three disjunct Hall elements (Hall tubs) 60, 62, 64, the contacts $C_1$, $C_2$, $C_3$ of which are connected to the terminals T1, T2 and T3 so that the Hall elements are connected in parallel. In examples of the present disclosure, some or all of the magnetic field sensitive devices may be formed by several magnetic field sensitive elements connected in series or may be formed by several magnetic field sensitive elements connected in parallel, such as those shown in FIGS. 5 and 6.

As described above with respect to FIG. 1, currents 42 and 44 are injected (impressed) into the magnetic field sensitive devices 10 and 20 and the sum 49 of the currents 42 and 44 flows through the magnetic field sensitive device 30. Thus, if equal devices 10, 20 and 30 are used, a supply voltage drop across the supply terminals of device 30 is higher than a supply voltage drop across the supply terminals of each of devices 10 and 20. According to examples of the present disclosure, magnetic field sensitive device 30 is modified so that its internal resistance is lower than that of the magnetic field sensitive devices 10 and 20. Thus, the apparatus may be configured to cause a supply voltage drop across supply terminals of the magnetic field sensitive devices to correspond to each other. In this context, corresponding may mean that the supply voltages do not deviate from each other by more than 20% with respect to the highest supply voltage. Ideally, the supply voltages may be identical.

There are several possibilities to reduce the internal resistance of a magnetic field sensitive device, such as device 30, relative to another magnetic field sensitive device, such as devices 10 and 20:

1) The doping concentration of the active area of the device can be larger than that of the other devices.

2) The layout of the device can be modified, e.g. the spacing of contacts of the device, which act as supply terminals, can be smaller than the spacing of the corresponding contacts of the other devices.

3) The width of the active area of the device can be larger than the width of the other devices.

4) A pn junction for isolating the device can be biased with a smaller reverse bias voltage than that of the other devices since a depletion layer of the reverse-biased pn junction reduces the active Hall effect region of the respective device. In this context, a reverse bias voltage resulting in a thicker depletion layer is regarded as representing a larger reverse bias voltage when compared to a reverse bias voltage resulting in a thinner depletion layer. Thus, the terms "larger" and "smaller" refer to the absolute value of the reverse bias voltage.

5) The device can be implemented as a parallel connection of several devices identical to the other devices. In this context, a parallel connection of Hall effect devices means at least two Hall effect devices with corresponding contacts shorted to each other, such as at least two 3C-Halls (say device m and n) with contacts $C1m$, $C2m$, $C3m$ and $C1n$, $C2n$, $C3n$, where $C1m$ is shorted with $C1n$, $C2m$ is shorted with $C2n$, and $C3m$ is shorted with $C3n$.

Which of the possibilities is used to reduce the internal resistance may depend on the structure of the magnetic field sensitive device. Possibilities 1, 2, and 4 may not be well suited to modify the internal resistance of a vertical Hall effect device in a well-defined and cheap way. Better solutions for a vertical Hall effect device may be possibilities 3 and 5. For Hall-plates (HHalls) it may be difficult to modify the thickness of the active Hall-effect region, because the thickness is defined by the technology and one usually may have to work with one specific thickness for all Hall-plates on a wafer. Therefore, a better solution for HHalls may be possibility 5, i.e. the parallel connection of several devices. For VHalls it is simple to adjust the width, because it is a free layout parameter and so possibility 3 may be well suited for VHalls, but possibility 5 is also an option for VHalls.

Figure 7:
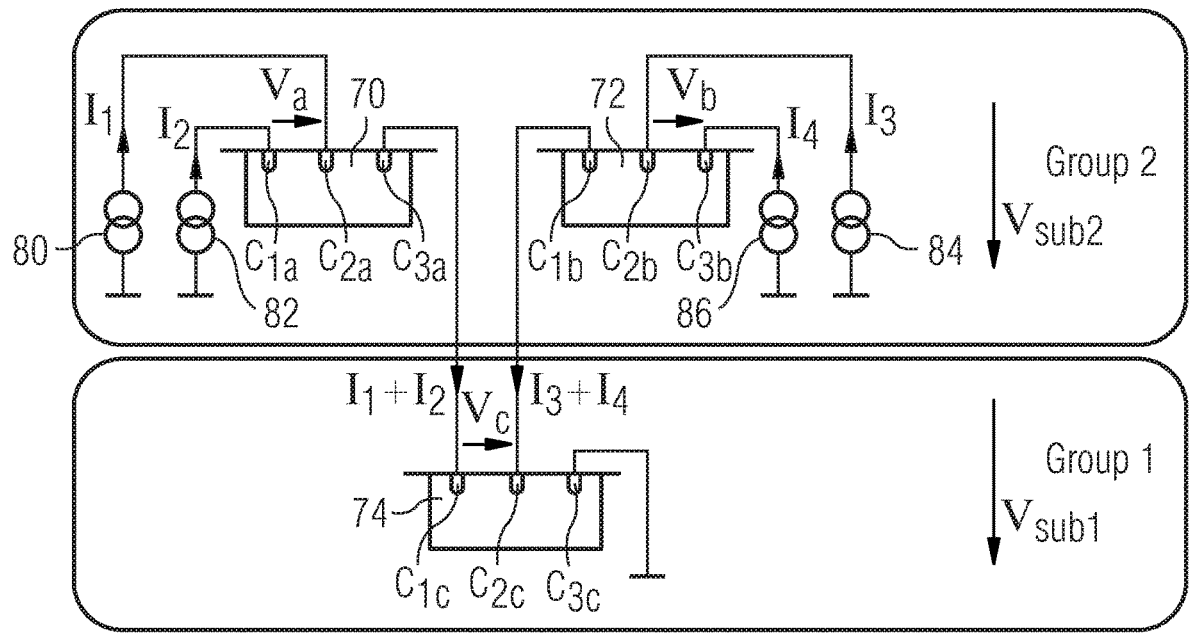
FIG. 7 shows a schematic view of an example of an apparatus comprising first to third magnetic field sensitive devices.

FIG. 7 shows a circuit of three vertical Hall effect devices 70, 72 and 74 according to an example. The vertical Hall effect devices may have a structure as described above referring to FIG. 3. In the example shown in FIG. 7, a power supply comprises four current sources 80, 82, 84, and 86. Current source 80 is coupled to a first contact $C_{1a}$ of the first Hall effect device 70, current source 82 is coupled to a second contact $C_{2a}$ of the first Hall effect device 70, current source 84 is coupled to a first contact $C_{3b}$ of the second Hall effect device 72 and current source 86 is coupled to a second contact $C_{2b}$ of the second Hall effect device 72. A third contact $C_{3a}$ of the first Hall effect device 70 is coupled to a first contact $C_{1c}$ of the third Hall effect device 74. A third contact $C_{1b}$ of the second Hall effect device 72 is coupled to a second contact $C_{2C}$ of the third Hall effect device 74. A third contact $C_{3C}$ of the third Hall effect device 74 is coupled to a reference potential, such as ground. The Hall effect device 74 belongs to a group 1 and the Hall effect devices 70 and 72 belong to a group 2.

The current source 80 is configured to inject a current $I_1$ into contact $C_{1a}$, the current source 82 is configured to inject a current $I_2$ into contact $C_{2a}$, the current source 84 is configured to inject a current $I_3$ into contact $C_{3b}$, and the current source 86 is configured to inject a current $I_4$ into contact $C_{2b}$. This will result in a maximum supply voltage $V_{sup2}=\max\{V_{C1a-C3a}, V_{C2a-C3a}, V_{C2b-C1b}, V_{C3b-C1b}\}$ in group 2. In order to avoid any doubts, it is to be noted that $V_{sup2}$ does not represent a voltage drop across current source 84 but represents the maximum supply voltage across two of the supply contacts. The sum of currents I1+I2 flows into contact $C_{1c}$ of device 74 in group 1 and the sum of currents I3+I4 flows into contact $C_{2c}$ of device 74 in group 1. Thus a maximum supply voltage $V_{sup1}=\max\{V_{C1c-C3c}, V_{C2c-C3c}\}$ in group 1 establishes. If all devices 70, 72 and 74 are equal and all currents I1, I2, I3, I4 are equal it is obvious that $V_{sup1}>V_{sup2}$, because more current flows through device 74 than through each of devices 70 and 72. Since the residual offset of a spinning current scheme of Hall effect devices is larger with larger supply voltage, device 74 will have larger standard deviation of residual offset than devices 70 and 72—and this is suboptimal.

In examples of the present disclosure, device 74 is modified so that its internal resistance is lower than of devices 70 and 72, so that $V_{sup1}$ is similar to $V_{sup2}$ (corresponds to $V_{sup2}$). Then, the total supply voltage $V_{sup1}+V_{sup2}$ is distributed (at least approximately) equally over both groups. Thus, all devices may be operated at a comparably low supply voltage and this may give a small residual offset.

As shown in FIG. 7, output signals (voltages) $V_a$, $V_b$ and $V_c$ may be tapped (read out) between the respective contacts at which currents are injected into the respective device, i.e., contacts $C_{1a}$ and $C_{2a}$ of device 70, contacts $C_{3b}$ and $C_{2b}$ of device 72 and contacts $C_{1c}$ and $C_{2c}$ of device 74. The output signals $V_a$, $V_b$ and $V_c$ may be combined (such as added or subtracted) to give a total output signal. A signal conditioning circuit may be provided to read out the output signals, which may consider that $V_c$ is on a lower common mode potential than $V_a$ and $V_b$.

As set forth above, Hall effect device 74 may be regarded as belonging to a group 1 and Hall effect devices 70 and 72 may be regarded as belonging to a group 2. The arrangement of Hall effect devices shown in FIG. 7 may be regarded as a funnel of two groups or layers (wherein these terms may be used exchangable).

The concept underlying the present disclosure may be extended to more than two groups. In examples of the present disclosure, the apparatus may comprise a plurality of magnetic field sensitive devices, which are grouped in N groups (or layers), with N>1. Each group k comprises $2^{k-1}$ magnetic field sensitive devices, for $1 \leq k \leq N$. k and N are natural numbers and k is an index for the respective group from 1 to N. The power source may be configured to independently provide a supply current through each magnetic field sensitive device of group N. The plurality of magnetic field sensitive devices are coupled such that, for $1<k \leq N$, supply currents flowing through two magnetic field sensitive devices in group k flow through one magnetic field sensitive device in group k−1. In other words, supply currents flowing through two magnetic field sensitive devices in a group having a higher number flow through two magnetic field sensitive devices in the group having the next lower number. In examples, there are N supply current paths through the apparatus, wherein each supply current path extends through exactly one magnetic field sensitive device in each group. In examples, there is no permanent ohmic connection between the magnetic field sensitive devices in group N in addition to the connection via one magnetic field sensitive device in group N−1. In other words, in examples, there is no permanent ohmic connection between active regions of the magnetic field sensitive devices in group N in addition to the connection via one magnetic field sensitive device in group N−1.

In examples, each of the magnetic field sensitive devices comprises three terminals, wherein the power source comprises, for each of the magnetic field sensitive devices in group N, a first current source to inject a current into a first terminal of the corresponding magnetic field sensitive device. In examples, the power source comprises, for at least some of the magnetic field sensitive devices in group N, a second current source to inject a current into a second terminal of the corresponding magnetic field sensitive device, wherein a third terminal of the corresponding magnetic field sensitive device is coupled to one terminal of a magnetic field sensitive device in group N−1. In such examples, for $1 \leq k < N$ and for each magnetic field sensitive device in group k, a first terminal may be coupled to a third terminal of a magnetic field sensitive device in group k+1, a second terminal may be coupled to a third terminal of another magnetic field sensitive device in group k+1, and either, for k=1, a third terminal may be coupled to a reference potential or a current source, or, for k≠1, a third terminal may be coupled to a terminal of a magnetic field sensitive device in group k−1. In examples, the apparatus is configured to tap an output signal at at least one terminal of at least one magnetic field sensitive device of each group and to combine the tapped output signal to an overall output signal. In examples, the output signal is tapped between the first and second terminals of the magnetic field sensitive devices.

Generally, in examples of the present disclosure, the internal resistance which a magnetic field sensitive device of group k provides to the supply current may be smaller than the internal resistance which a magnetic field sensitive device of group k+1 provides to the supply current, for at least one k with $1<k \leq N$.

In examples, the currents provided through each magnetic field sensitive device in group N may be identical. With reference to FIG. 7, currents $I_1$, $I_2$, $I_3$ and $I_4$ may be nominally identical. In practice, of course, there may be some unavoidable mismatch between the four current sources 80, 82, 84, 86. This may be tackled by conventional DEM (dynamic element matching) strategies. To this end, a control circuit may permutate the four current sources cyclically or stochastically and may compute averages of output signals.

In examples, devices 70 and 72 may be identical. In examples, all devices in a single group are equal. Nevertheless, it would be possible to use a scaling factor, e.g. to choose $I_1=I_2=2*I_3=2*I_4$ and use two parallel connected devices b instead of device a.

If all currents $I_1$, $I_2$, $I_3$ and $I_4$ are identical and devices 70 and 72 are identical, device 74 may have half of the internal resistance of devices 70 and 72. Therefore, device 74 may have either a double width when compared to devices 70, 72 (while all other parameters of the devices are equal)—or device 74 may be a parallel connection of two devices identical to devices 70, 72. Then the current through device 74 is twice the current through device 70 and the voltages per group (layer) are equal: $V_{sup1}=V_{sup2}$.

It goes without saying that each of the Hall effect devices 70, 72, 74 may be implemented by a Hall-plate, such as a triangular one as shown in FIG. 2, or it may be a composite device like the ones shown in FIGS. 5 and 6. The advantage of these devices is that they are electrically symmetrical, so that at constant currents $I_1$, $I_2$, $I_3$, $I_4$ the supply voltage $V_{sup2}$ is constant no matter, which pairs of contacts serve as input current terminals.

Moreover the individual devices may have identical or different orientation with respect to the magnetic field and they may be located nearby to each other to be exposed to essentially the same magnetic field or they may be located at significant distance from each other (e.g. left and right side of a chip) to sample the magnetic field at different points (as is the case in a gradiometer).

Figure 8:
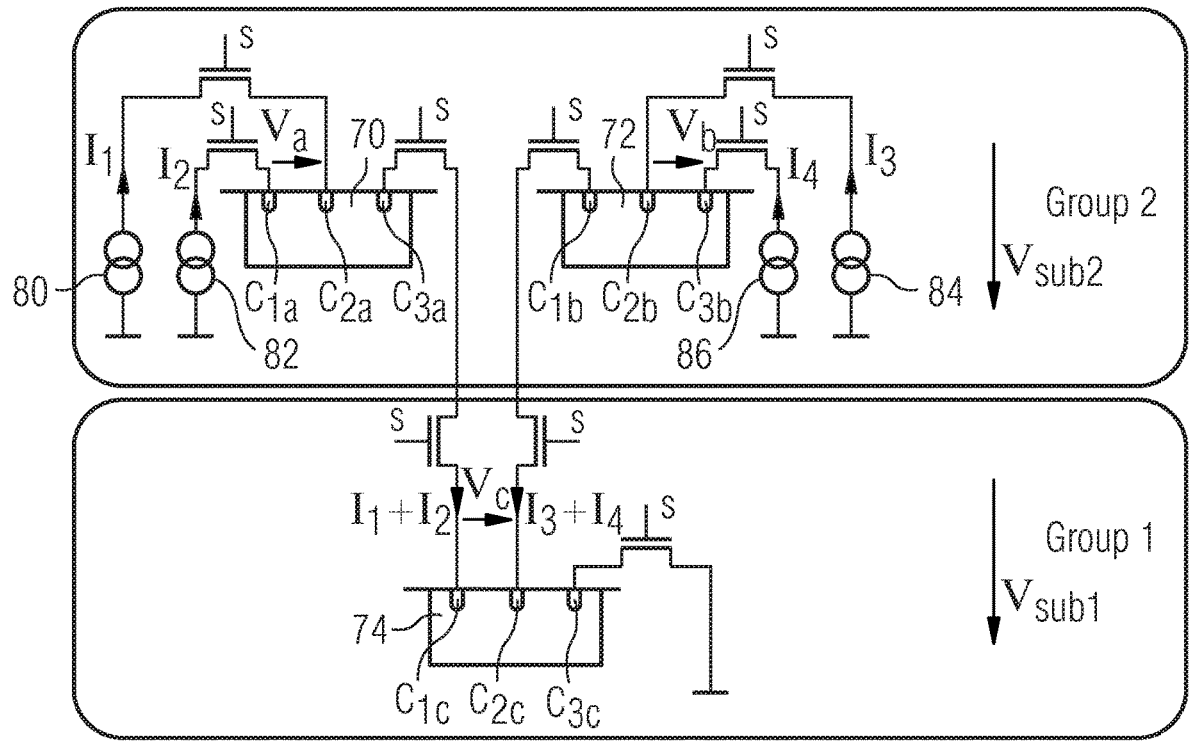
FIG. 8 shows a schematic view of an example of an apparatus comprising first to third magnetic field sensitive devices, which includes switches.

In examples, the circuit diagram in FIG. 7 represents a snapshot during one operating phase of a spinning current operation or circuit commutation operation. Generally, a spinning current operation or circuit commutation operation may include a plurality of operating phases and is sometimes call spinning current scheme. Switches may be associated with each contact. For the sake of simplicity, switches associated with each contact are not shown in FIG. 7. These switches may be used to selectively connect different ones of the contacts of the Hall effect devices to the current sources, to connect a different one of the contacts of the Hall effect devices to a reference potential, such as ground, and to connect (short) a different ones of the contacts of group 2 with contacts of group 1. FIG. 8 shows an example of an apparatus corresponding to the apparatus of FIG. 7 with the exception that switches S are shown. In FIG. 8 only those switches of a switching array are shown, which are closed (conducting) during the operating phase (switching state) shown in FIG. 7 to obtain the coupling of the devices 70, 72 and 74, which is shown in FIG. 7.

Accordingly, FIG. 8 shows an example of the apparatus with all active (i.e. conducting) switches necessary to route current through the Hall effect devices during one operating mode or operating phase of a spinning current operation or contact commutation operation for offset cancellation. The switches are symbolized by NMOS transistors, however, they may also implemented by PMOS transistors or transmission gates or any other technology. The switches for tapping potentials $V_a$, $V_b$, $V_c$ are not shown because it is obvious that they may be connected between one of the respective contacts $C_{1a}$, $C_{2a}$, $C_{2b}$, $C_{3b}$, $C_{1c}$, $C_{2c}$ and some pre-amplifier input. Each active switch may be attributed to a contact which it is connected to. Therefore, there are two switches in series between contacts $C_{3a}$ and $C_{1c}$. These switches may be merged to a single switch. The same applies to the two switches connected in series between contacts $C_{1b}$ and $C_{2c}$.

An example of a spinning current operation or circuit commutation operation for the apparatus shown in FIG. 8 is now described.

In an operating phase 1, the connections are made as shown in FIG. 8 and the signals are also tapped as shown in FIG. 8.

In an operating phase 2, current $I_2$ is still injected into contact $C_{1a}$, current $I_4$ is still injected into contact $C_{3b}$, while current $I_1$ is now injected into contact $C_{3a}$, current $I_3$ is now injected into contact $C_{1b}$, and contacts $C_{2a}$ and $C_{2b}$ are now connected to group 1. In group 1, the currents from devices 70 and 72 may flow into the same contacts $C_{1c}$, $C_{2c}$ as in operating phase 1 or may flow into contacts $C_{1c}$ and $C_{3c}$. So it is possible to operate only a few devices in a group or only devices in specific groups in spinning operations and leave the other devices in a non-spinning operation (of course then their signal may suffer from higher offset error but this could be irrelevant, if the devices are only used for an AC detection of magnetic fields, while the devices operated in a spinning operation may be used also for a DC detection of magnetic fields). Moreover, it is possible to operate devices at different spinning frequencies: e.g. devices in group 2 might be operated only at half of the spinning frequency when compared to devices in group 1, which means that the connections of devices in group 2 are changed only every second time the connections of devices in group 1 are changed. The signals of each device are tapped between the two contacts of the device, into which the currents are injected.

In an operating phase 3, current $I_1$ is injected into contact $C_{3a}$, current $I_3$ is injected into contact $C_{1b}$, current $I_2$ is injected into contact $C_{2a}$, current $I_4$ is injected into contact $C2b$, and contacts $C_{1a}$ and $C_{3b}$ are connected to group 1. In group 1, the currents from devices 70 and 72 may flow into the same contacts $C_{1c}$, $C_{2c}$ as in the first operating phase or into contacts $C_{2c}$ and $C_{3c}$ or into contacts $C_{1c}$, $C_{3c}$. The signals of each device are tapped between the two contacts of the device, into which the currents are injected.

Finally the signals of all spinning devices in all three phases are combined (e.g. added or averaged or low-pass filtered or integrated) to give the total output signal, which may have a greatly reduced zero point error (=offset error).

In the example described referring to FIGS. 7 and 8, the output signals are tapped between contacts of the same device: $C_{1a}$-$C_{2a}$, $C_{2b}$-$C_{3b}$, $C_{1c}$-$C_{2c}$. In principle, the potential of any terminal may be used as an output signal by sampling the voltage of this terminal relative to ground or to some other (arbitrary) reference potential, as long as this reference potential is constant in all operating phases of the spinning operation. In such case, the reference potential may be maintained close to the potential of the respective terminal since, then, a circuit processing the output signals may handle the output signals better. Generally, the reference potential may be selected so that the output signals of individual operating phases are not more than 100 to 1000 times larger than the combined signal of the entire spinning operation. Otherwise, if the potentials are sampled against a low reference potential, such as ground, the signals of individual operating phases are in the order of volts, wherein, in the spinning operation they may be basically subtracted so that only tiny differences caused by the magnetic field are left. The subtraction of large quantities may lead to larger errors than the subtraction of small quantities.

An alternative way to tap the signals may be achieved by a modification of the apparatus of FIG. 8. In an alternative example, the current sources 82 and 86 may be skipped and the voltage between contacts $C_{1a}$ and $C_{3b}$ may be sampled, rather than $V_a$ and $V_b$. Thus, in examples, the apparatus may be configured to tap a voltage between respective terminals of two magnetic field sensitive devices in one group as an output signal. This may result in a larger signal to noise ratio when compared to the approach in FIG. 8, but may be less effective in cancelling out the offset error of the devices.

As already indicated above, in examples of the present disclosure, at least some (or all) of the magnetic field sensitive devices comprise at least three contacts and a switching array configured to selectively couple the at least three contacts to at least three supply terminals of the respective magnetic field sensitive device. The switching array may further be configured to selectively couple a first output terminal to one of the three contacts and to selectively couple a second output terminal to one of the three contacts.

Figure 9:
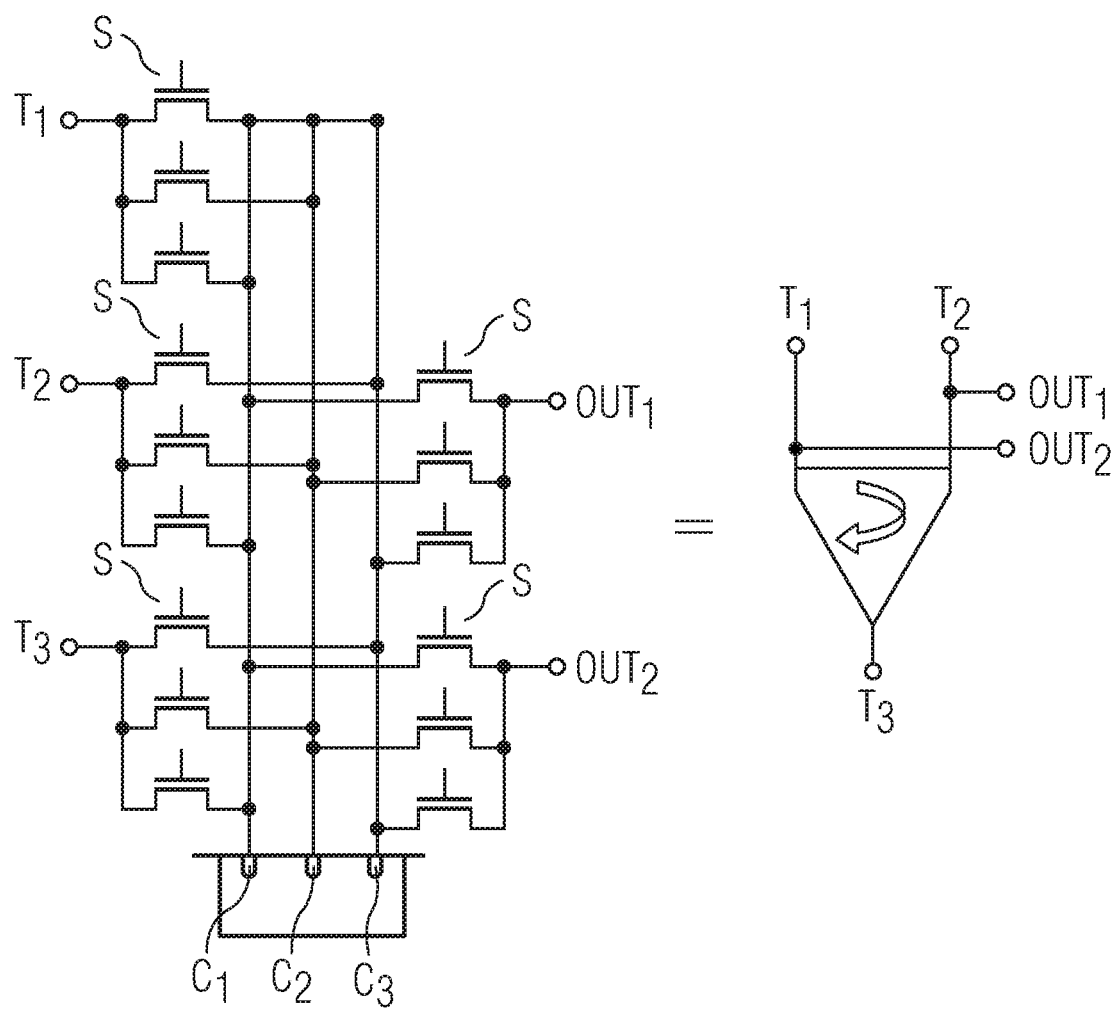
FIG. 9 shows a schematic view of an example of a magnetic field sensitive device.

An example of a magnetic field sensitive device comprising a switching array is shown in FIG. 9. FIG. 9 shows one possibility of a sub-circuit comprising a Hall effect device with three contacts $C_1$, $C_2$ and $C_3$, wherein switches S are connected to the contacts of the Hall effect device and to the terminals $T_1$, $T_2$ and $T_3$. One switch is provided between each contact $C_1$, $C_2$, $C_3$ and each terminal $T_1$, $T_2$, $T_3$ so that each contact can be coupled to each terminal selectively. The terminals $T_1$, $T_2$, $T_3$ are used as supply terminals to supply the device with power and to route current through the device. In examples, only two supply terminals may be provided or used during an individual operating phase to supply the device with power. In addition, one additional switch may be provided between each contact (or each terminal) and each of two outputs OUT1, OUT2 so that each contact (or terminal) can be coupled to each output. The outputs (terminals) OUT1, OUT2 are used to tap the output signal. In examples, only one output may be provided or used to tap the output signal.

Examples of the apparatus described herein comprise a control circuit configured to control the switches to implement the different operating phases of a circuit commutation operation (or spinning current operation).

The symbol at the right hand side of FIG. 9 is a shortcut symbol, wherein the outputs OUT1, OUT2 may also be connected to others of the terminals T1, T2, T3 depending on the state of the switches S. The arrow in the shortcut symbol denotes that the contacts can be commutated, i.e. a spinning operation can be applied.

Figure 10:
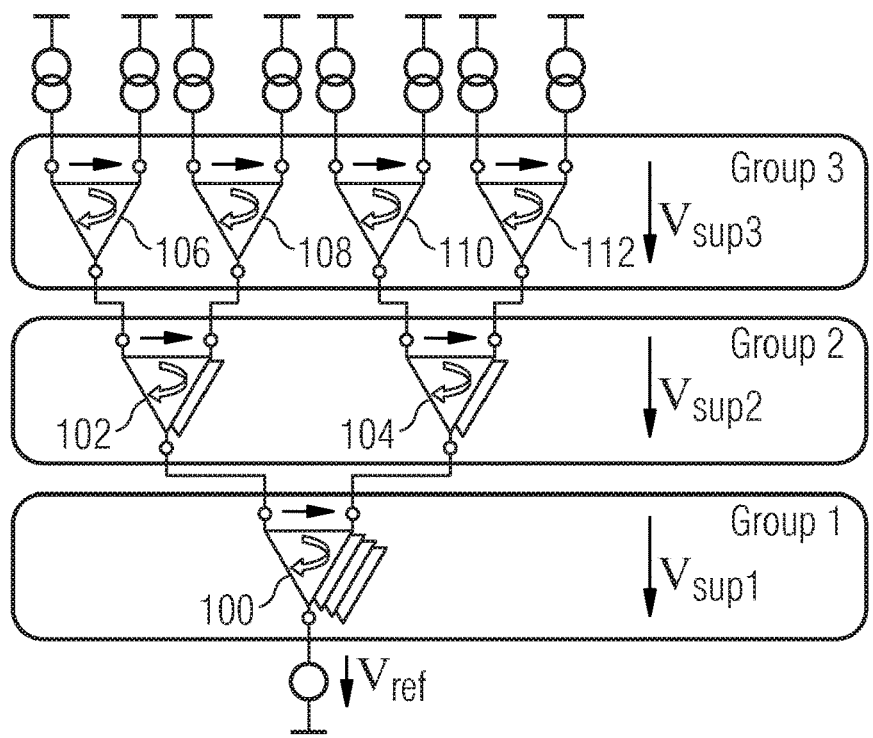
FIG. 10 shows a schematic view of an example of an apparatus comprising three groups of magnetic field sensitive devices.
Figure 11:
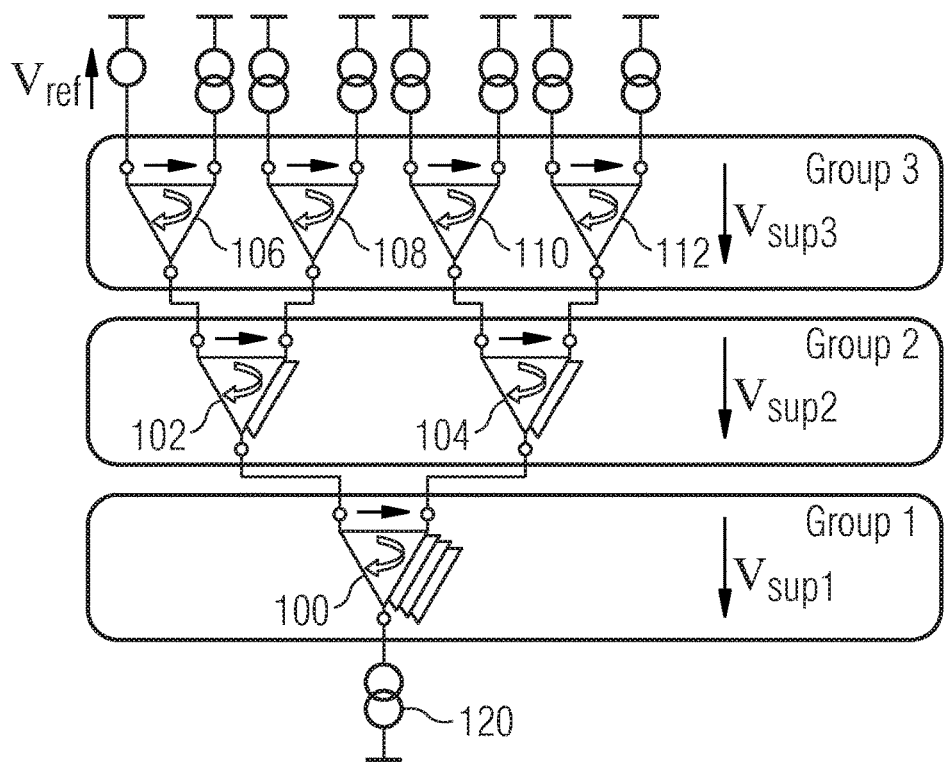
FIG. 11 shows a schematic view of another example of an apparatus comprising three groups of magnetic field sensitive devices.

Using the shortcut symbol of FIG. 9 more complicated arrangements comprising more than two groups of magnetic field sensitive devices are now described referring to FIGS. 10 and 11.

FIG. 10 shows an example of an apparatus for detecting a magnet field, which comprises three groups of magnetic field sensitive devices. The arrangement of FIG. 10 may be regarded as a funnel with three groups (layers). Group 1 comprises one magnetic field sensitive device 100, group 2 comprises two magnetic field sensitive devices 102 and 104, and group 3 comprises four magnetic field sensitive devices 106, 108, 110, and 112. A power source comprises eight current sources, which are coupled to terminals of the magnetic field sensitive devices in group 3. A first current source is coupled to a first supply terminal of device 106, a second current source is coupled to a second supply terminal of device 106, a third current source is coupled to a first supply terminal of device 108, a fourth current source is coupled to a second supply terminal of device 108, a fifth current source is coupled to a first supply terminal of device 110, a sixth current source is coupled to a second supply terminal of device 110, a seventh current source is coupled to a first supply terminal of device 112, and an eighth current source is coupled to a second supply terminal of device 112. A third supply terminal of device 106 is coupled to a first supply terminal of device 102, a third supply terminal of device 108 is coupled to a second supply terminal of device 102, a third supply terminal of device 110 is coupled to a first supply terminal of device 104, and a third supply terminal of device 112 is coupled to a second supply terminal of device 104. A third supply terminal of device 102 is coupled to a first supply terminal of device 100, and a third supply terminal of device 102 is coupled to a second supply terminal of device 100. The third supply terminal of device 100 is coupled to a reference potential $V_{ref}$, such as ground.

In operation, the first and second current sources provide a supply current through device 106, the third and fourth current sources provide a supply current through device 108, the fifth and sixth current sources provide a supply current through device 110 and the seventh and eight current sources provide a supply current through device 112. Thus, there are four supply current paths through the apparatus shown in FIG. 10, a first one runs through the devices 106, 102 and 100, a second one runs through the devices 108, 102 and 100, a third one runs through the devices 110, 104 and 100, and a fourth one runs through the devices 112, 104 and 100.

In examples, the apparatus is configured to control the switches associated with each of the magnetic field sensitive devices to change between different switching states defining different couplings between the supply terminals and the contacts and between the output terminals and the contacts in order to obtain an offset reduction or an offset compensation.

Generally, the supply currents may have two polarities. The current sources may inject current into the devices of group N. Then, the reference potential $V_{ref}$ may be low, e.g. 0V. However, the current sources may also draw current out of the devices in group N. Then $V_{ref}$ may be large, e.g. between 2V and 3V. In examples, in a spinning current operation or contact commutation operation half of the operating phases may inject current into the devices in group N while the other half of the operating phases may draw current out of devices of group N. Generally, the supply current polarity may be switched to be different in different operating phases in an effort to reverse the supply current polarity through each device in order to cancel out thermoelectric errors in the spinning operation, which may be one of several origins for Hall device offset errors.

In examples, the internal resistances of the magnetic field sensitive devices in the respective groups are adjusted so that maximum voltage drops $V_{sup1}$, $V_{sup2}$ and $V_{sup3}$ in each group correspond to each other, i.e. they are similar. The internal resistance of each magnetic field sensitive device in group 2 may be half of the internal resistance of each magnetic field sensitive device in group 3, and the internal resistance of each magnetic field sensitive device in group 1 may be half of the internal resistance of each magnetic field sensitive device in group 2. As symbolized in FIG. 10, each magnetic field sensitive device in group 3 (group N) may be formed by a magnetic field sensitive device representing a unit device. Each magnetic field sensitive device in group 2 may be formed by a parallel connection of two unit devices each of the and each magnetic field sensitive device in group 1 may be formed by a parallel connection of four unit devices. If all unit devices are equal and all currents are equal and the devices are electrically symmetric, it holds $V_{sup1}=V_{sup2}=V_{sup3}$ for all operating phases of a spinning operation.

What follows is an explanation how spinning operations may be implemented if the devices are not electrically symmetric. The explanation refers to magnetic field sensitive devices as shown in FIG. 8. If equal currents are injected into two neighboring contacts (such as contacts $C_{1a}$ and $C_{2a}$ of device 70), the voltage drop across the device is larger than if currents are injected into both outer contacts (such as contacts $C_{1a}$ and $C_{3a}$ of device 70). Due to electrical non-linearity of the device even a mere reversal of the current flow direction may also change the voltage drop to a certain (small but still detectable) extent. So in general one may say that each device can be operated in a couple of operating phases where some of them may have identical voltage drops over the device (between current inputs and outputs) but others will have substantially identical voltage drops. For the purpose of this explanation, one may not have to care about which operating phases lead to which voltage drop— instead one may simply define that the voltage drops can be put in a rising order $V_{supph1}<V_{supph2}<V_{supph3}<\ldots V_{supphn}$, where n is not larger than the total number of operating phases. For symmetrical devices n=1 and for asymmetrical devices it is at least 2 or more. Next, one may discriminate between operating phases of individual devices (=device operating phases) and operating phases of the complete funnel circuit (i.e. arrangement of magnetic field sensitive devices as explained herein) of devices (=funnel operating phases). At a certain time, a device #1 may be operated in operating phase 2 while device #2 may be operated in operating phase 3. The combination of all these operating phases of individual devices at a certain instant of time may be called "funnel operating phase". If this combination is changed in a subsequent instant of time (step), one may speak of first versus second funnel operating phase, and so on.

With these definitions, one can explain different strategies of operating a funnel circuit in a spinning operation:

(i) One approach is to operate all devices of all groups (and, thus, all devices of the complete funnel circuit) in phases with identical supply voltages for all operating phases of the spinning operation. Thus, in a first funnel operating phase all devices may be operated in their operating phase 2, in a second funnel operating phase, they may be operated in phase 3, and so on. But, if by incidence device operating phases 1 and 3 have the same supply voltage, then of course it is also possible to operate some devices in their phases 1 and others in their phases 3. This is the case for the devices 70 and 72 in FIG. 8.

(ii) Another approach is to operate all devices of a first group at operating phases with a first supply voltage, but to operate all devices of a second group at operating phases with a second supply voltage, and so on. This holds for a first funnel operating phase. In a second funnel operating phase, all devices of the first group may be operated at operating phases with the second supply voltage and all devices of the second group may be operated at the first supply voltage. In this operation the supply voltages of different groups generally differ. A particular example may combine device operating phases such that the sum of supply voltages over all groups (i.e. of the entire funnel) is identical for all funnel operating phases (or at least its fluctuation between different funnel operating phases is minimized). This may give the highest efficiency for the funnel circuit, because it uses the same current and the same voltage during all funnel operating phases. This is explained with an example: It may be even advantageous for electrically asymmetric devices to operate the devices of various groups in different operating modes. For example, if one uses a device like in FIG. 3 there are two groups of operating phases: if the two currents flow in or out of two neighboring contacts the supply voltage is larger than if the currents flow in or out of the two outer contacts. So one can speak of low-ohmic phases and high-ohmic phases. In an arrangement (funnel) with an even number of groups (layers) it may be advantageous to operate the devices in one half of the groups in low-ohmic phases and in the other half of the groups in high-ohmic phases, since then the maximum potential at contacts connected to the current sources (i.e. contacts in group N) may remain (at least nearly) constant over all operating phases.

In the example shown in FIG. 10, a current distribution is forced by coupling the first and second terminals of each magnetic field sensitive device in group N to one of the current sources. In other examples, the same current distribution may be forced in a different manner. FIG. 11 shows such an example. The apparatus shown in FIG. 11 is different from the apparatus shown in FIG. 10 in that the first terminal of magnetic field sensitive device 106 is coupled to a reference potential $V_{ref}$, rather than to one of the current sources, and that the third terminal of magnetic field sensitive device 100 is coupled to a current source 120, rather than to the reference potential. Thus, according to the example of FIG. 11, a current is forced into all but one of the first and second terminals in group N, wherein a potential is forced at this one terminal in group N, while a current is also forced into one terminal of group 1. If all current sources connected to group N force equal currents, then the current source 120 connected to group 1 may force eight times this current of opposite polarity. The bias circuit shown in FIG. 11 may suffer from a slight asymmetry since the polarity of current source 120 connected to group 1 is opposite to the polarity of current sources connected to group 1. Thus, in practice it may be difficult to make the current at group 1 accurately enough and this may give rise to an error in the output signals.

Generally, in examples, in an arrangement of N groups, $2^N$ equal current sources may be connected to the $2^{N-1}$ devices in group N. There may be $2^{N-2}$ devices in group N−1, ..., and a single device in group 1. If one uses unit devices, then group N may use unit devices, while group N−1 uses devices which are two unit devices connected in parallel and group N−2 uses devices, which are four unit devices connected in parallel, ... and finally group N uses a device, which is $2^{N-1}$ unit devices connected in parallel. In such an example, the total number of unit devices is $N*2^{N-1}$, which is four unit devices for two groups, twelve unit devices for three groups, thirty-two unit devices for four groups, and eighty unit devices for five groups. It is to be noted that the residual offset decreases with the square-root of the number of devices since it is a stochastic quantity, in addition to the fact that each supply voltage decreases with an increasing number of devices.

Figure 12:
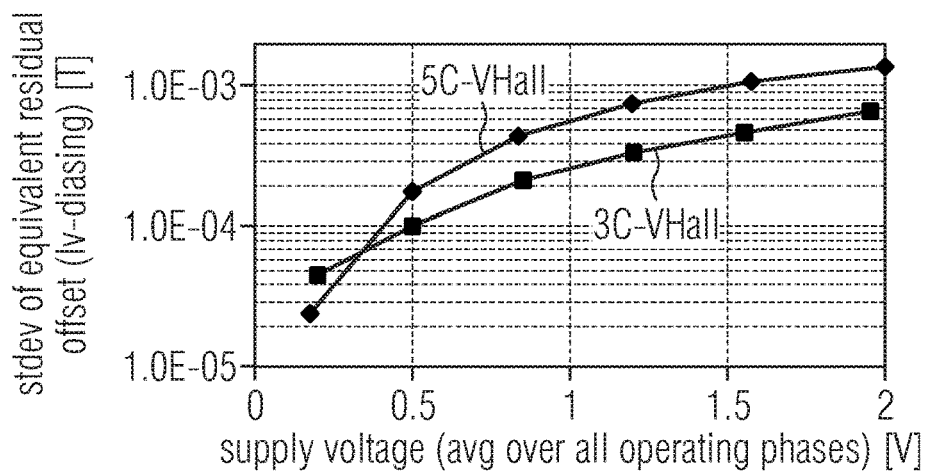
FIG. 12 shows a diagram of standard deviations of the residual offsets of single magnetic field sensitive devices with three and four contacts.

FIG. 12 shows the standard deviation of residual offsets of single devices with three and five contacts, wherein the device with three contact is identical to the device shown in FIG. 3. If one assumes that a system has a supply of 2.4 V available and that the residual offset of a single device grows versus the supply voltage as shown in FIG. 12, then one may obtain the following residual offsets of various funnel arrangements having a different number of groups (layers):

| number of groups | supply per group | number of unit devices | residual offset | total current |
| --- | --- | --- | --- | --- |
| 1 | 2.4 V | 1 | $700/\sqrt{1}$ = 700 µTrms | I0 |
| 2 | 1.2 V | 4 | $400/\sqrt{4}$ = 200 µTrms | I0 |
| 3 | 0.8 V | 12 | $200/\sqrt{12}$ = 58 µTrms | 1.33*I0 |
| 4 | 0.6 V | 32 | $120/\sqrt{32}$ = 21 µTrms | 2*I0 |
| 5 | 0.48 V | 80 | $95/\sqrt{80}$ = 11 µTrms | 3.2*I0 |

So it can be seen that examples described herein may be effective to reduce offset to very low values. Increasing the number of devices may result in an increased chip area required for the large number of devices and the associated switches, signal lines and wires. If one assumes a single 3C-VHall device as shown in FIG. 3 with a space consumption of 15 µm×10 µm and compares it to a conventional quadruple of Hall-plates with four contacts, which have a space consumption of 4*80 µm×80 µm, it is possible to place 171 3C-VHalls in the same space. A funnel arrangement with five groups (layers) has only 80 unit devices and, thus, fits into about half of the space. Accordingly, one may achieve similar residual offsets with 3C-VHalls than with 4C-HHalls, if the same chip size is used. In fact the volume of the 3C-VHalls may be about 3 times the volume of 4C-VHalls at the same layout size, because the 3C-VHalls reach 3 times deeper into the substrate.

As can be derived from the above table, the current consumption increases moderately. If one assumes unit current sources and unit devices and if one neglects the electrical non-linearity of the devices (i.e. the fact that the resistance of a device may increase by roughly 10%/V if its contacts are at higher potential), then a funnel with N groups may consume $(1/N)*2^{N-1}$ times more current than a single device.

Figure 13A:
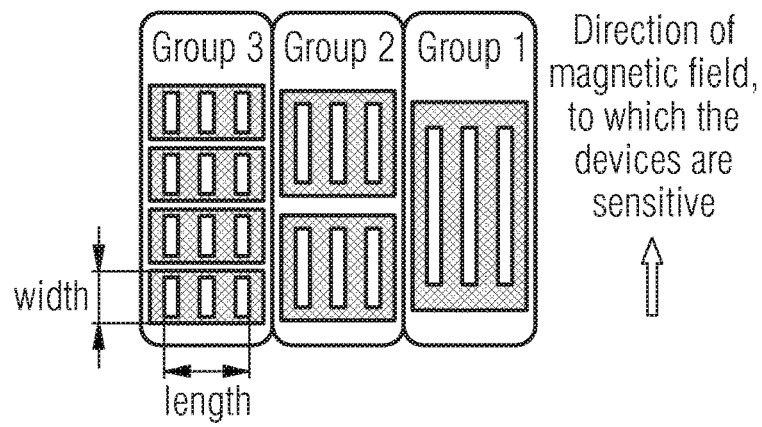
FIGS. 13a and 13b show schematic views of exemplary layouts of an apparatus of FIG. 10 or 11.
Figure 13B:
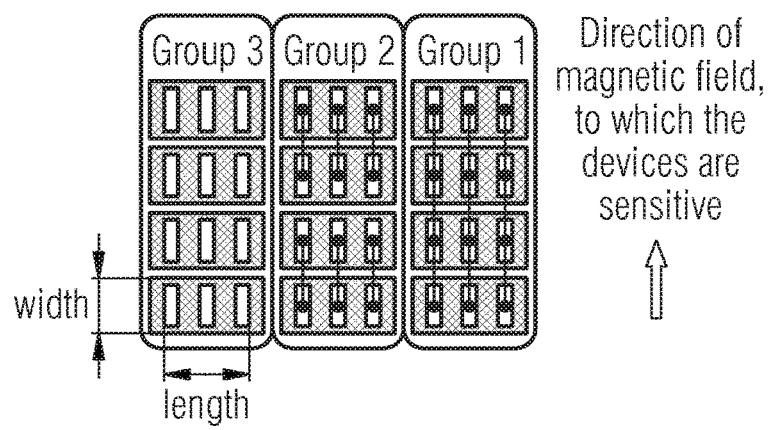

FIGS. 13a and 13b show examples of layouts for an apparatus having three groups of magnetic field sensitive devices, i.e. an apparatus as shown in FIG. 10, for example. In FIG. 13a, the widths of the devices are scaled to obtain reduced internal resistances in groups 2 and 3. For example, the width of the devices in group 2 may be about twice the width of the devices in group 3 and the width of the device in group 1 may be twice the width of the devices in group 2. In FIG. 13b, unit devices are used, wherein respective contacts of devices in group 2 and group 1 are shorted by wires. Thus, each magnetic field sensitive device in group 2 is formed by a parallel connection of two unit devices (each of which represents a magnetic field sensitive element) and the magnetic field sensitive device in group 1 is formed by a parallel connection of four unit devices. Of course it is possible to change the arrangement of the devices relative to each other (e.g. to line them up horizontally or vertically). It should be noted that the residual offset of Hall-effect devices may increase with increasing perimeter if the area of the device remains substantially unchanged, i.e. when major portions of the device are at its perimeter, because electrically non-linear phenomena like modulation of depletion width at the pn-isolation and charge modulation at trench isolation take place at the perimeter. Therefore a device with wide contacts like in Group 1 of FIG. 13a is very likely to exhibit smaller residual offset than the parallel connection of four unit devices like in Group 1 of FIG. 13b and this may reduce the residual offset of the complete apparatus even further.

In examples, the magnetic field sensitive devices are Hall effect devices. In examples, the magnetic field sensitive devices are vertical Hall effect devices.

Figure 14:
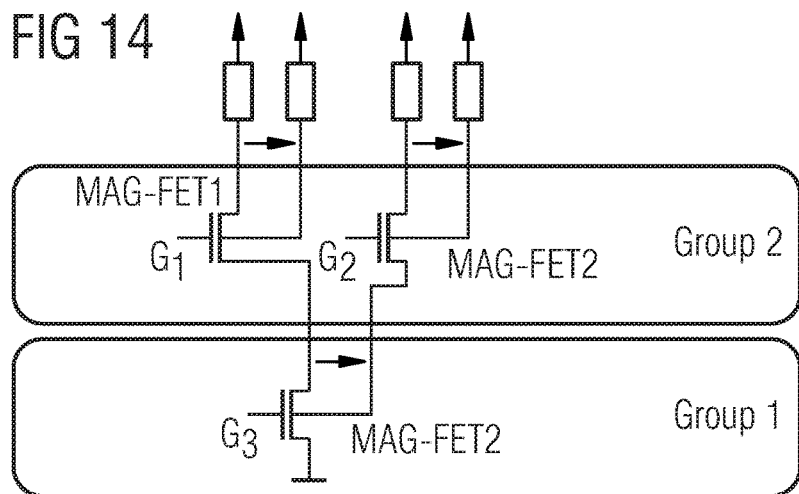
FIG. 14 shows a schematic view of an example of an apparatus comprising MAG-FETs.

In other examples, the magnetic field sensitive devices may be formed by other devices. For example, magnetic field sensitive MOSFETs (MAG-FETs) can use the same principle. In particular, split-drain MAG-FETs are devices similar to Hall effect devices and the channel thereof acts as Hall-effect region. In MAG-FETs, the concentration of charge carriers is affected by a gate-bulk-potential, which is different from Hall effect devices. In a MAG-FET, the supply contacts are a source contact and two drain contacts, since the drain is split into two parts. FIG. 14 shows an example of an apparatus comprising a funnel arrangement in two layers (groups), wherein group 1 comprises MAG-FET3 and group 2 comprises MAG-FET1 and MAG-FET2. The MAG-FETs are coupled so that the current from MAG-FET3 is split up in two equal parts at zero magnetic field and each part flows through one MAG-FET in group 2. If a magnetic field is applied, the currents through MAG-FET1 and MAG-FET2 are not equal anymore, because the Lorentz-force on the charge carriers in the channel of MAG-FET3 diverts them to one of both split drains. However, the difference between both drain currents of MAG-FET3 is only a few percent even at a high magnetic field. The output signals can be tapped between the two drains of each MAG-FET as indicated by arrows in FIG. 14. In an example, gates G1 and G2 are at equal potential. The drains of the MAG-FETs of group 2 may be connected to loads, i.e. resistances or current sources, which form part of a power source, in order to independently provide supply currents through MAG-FET1 and MAG-FET2.

In examples, internal resistances of the devices in each group are adjusted such that the supply voltage drops across each group are identical. However, as stated above, if the devices are asymmetric the supply voltage drops in a group with high-ohmic operating phases may be larger than the supply voltage drops in a group with low-ohmic operating phases. In such cases, a spinning operation may be implemented such that the average supply voltage drop taken over the complete spinning operation is identical in each group. In other examples, slightly different supply voltage drops or average supply voltage drops may be adjusted. For example, in an arrangement of three groups with a total supply voltage of 2V, the device widths (or in general the device resistances) may be adjusted such that in group 3 the supply voltage drop is 0.8V and in the other two groups the voltage drop is 0.6V. The offset of the devices in the top group will be slightly larger due to the larger supply voltage. Moreover, due to the electrical nonlinearity it might be difficult to adjust the device resistances so that the voltage is very precisely the same in each group. Thus, in practice it may be preferred to use unit devices and construct the devices of lower groups by connecting several unit devices in parallel. Then, due to the electrical non-linearity of the devices the supply voltage drop across group N may be slightly larger than across group N−1 (for example, roughly by 10%/V), so if group N is at 2V the internal resistance of its unit devices may be 20% larger than for the same unit devices at ground potential in the first group.

In examples, each magnetic field sensitive device is formed in a Hall effect region disjunct from the Hall effect regions of the other magnetic field sensitive devices.

Figure 15:
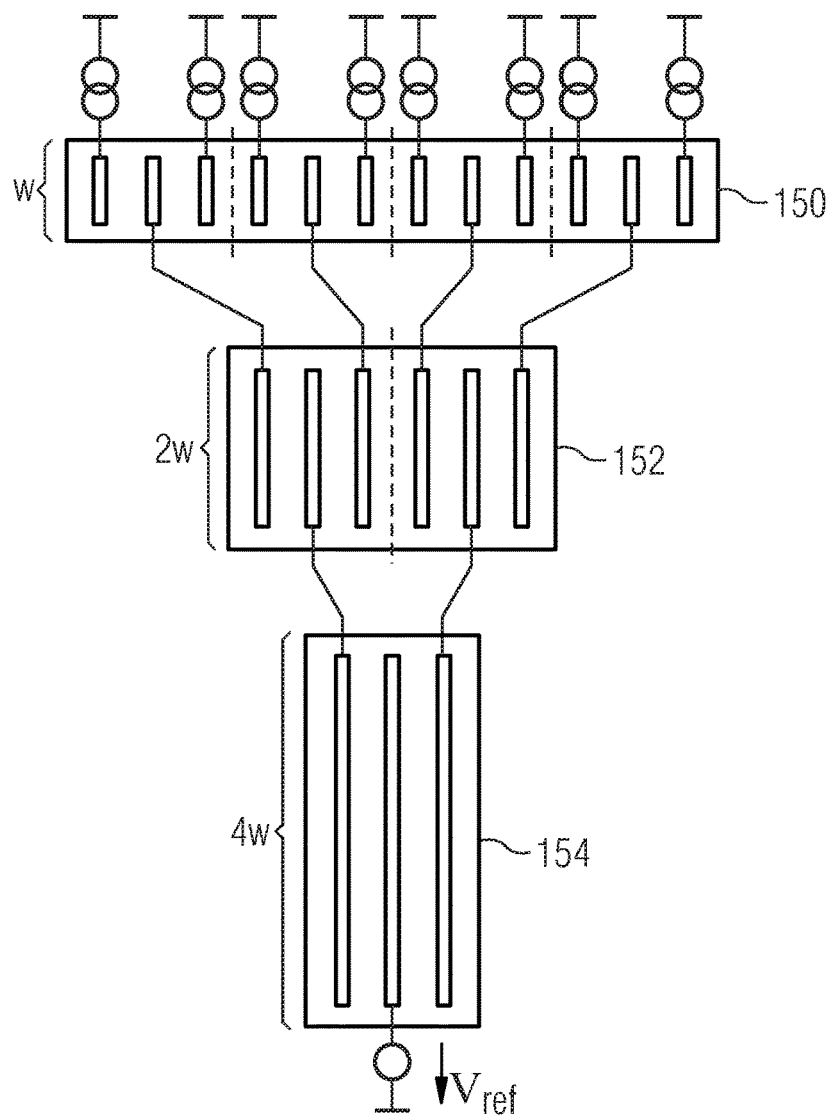
FIG. 15 shows a schematic view of an example in which devices in each group are formed by portions of a common Hall effect region.

In examples, some of the magnetic field sensitive devices may be formed in a common Hall effect region, wherein portions of the common Hall effect region acting as magnetic field sensitive devices are defined by the contacts of the Hall effect regions. FIG. 15 shows a schematic view of an example comprising three groups of devices (i.e., N=3), wherein the devices in each group are formed by portions of a common Hall effect region. The devices of group 3 are formed in a common Hall effect region 150, the devices in group 2 are formed in a common Hall effect region 152 and the device in the lowest group 1 is formed in a Hall effect region 154. Hall effect region 150 comprises twelve contacts side by side, Hall effect region 152 comprises six contacts side by side and Hall effect region 154 comprises three contacts side by side. Each magnetic field sensitive device is formed by three adjacent contacts as shown in FIG. 15 by broken lines. The contacts may be coupled to supply terminals as shown in FIG. 15. FIG. 15 shows the situation in one operating phase. Again, the contacts may be provided with a switching array to selectively couple the contacts to supply terminals and output terminals. As shown in FIG. 15, the widths of the Hall effect regions are adapted to adjust the internal resistance of the devices. For example, the width of Hall effect region 152 may be twice the width of Hall effect region 150 and the width of Hall effect region 154 may be twice the width of Hall effect region 152. Generally, in an apparatus comprising N groups, group k may have $3 \times 2^{k-1}$ contacts, with $1 \leq k \leq N$.

Figure 16:
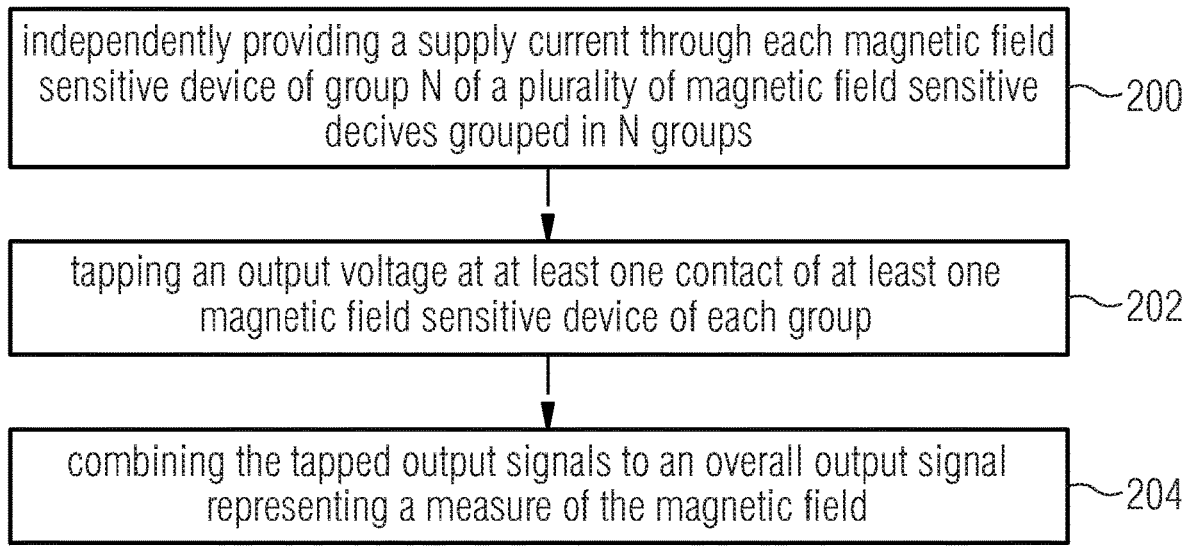
FIG. 16 shows a schematic flow chart of an example of a method for detecting a magnetic field.

FIG. 16 shows a flow chart of an example of a method for detecting a magnetic field according to the present disclosure. At 200, a supply current is provided independently through each magnetic field sensitive device of group N of a plurality of magnetic field sensitive devices grouped in N groups, with N>1, wherein each group k comprises $2^{k-1}$ magnetic field sensitive devices, for 1≤k≤N, wherein the plurality of magnetic field sensitive devices are coupled such that, for 1<k≤N, supply currents flowing through two magnetic field sensitive devices in group k flow through one magnetic field sensitive device in group k−1. At 202, an output voltage is tapped at at least one contact of at least one magnetic field sensitive device of each group. At 204, the tapped output signals are combined to an overall output signal representing a measure of the magnetic field.

In examples, the lowest group comprises more than one magnetic field sensitive device, i.e. k>1. In such examples, there is not a single device in the lowest group, through which the whole current flows.

In examples, independently providing a supply current through each magnetic field sensitive device in group N comprises for at least some of the magnetic field sensitive devices in group N forcing a current through (at) a first terminal of the respective magnetic field sensitive device and forcing a current through (at) a second terminal of the respective magnetic field sensitive device, wherein a third terminal of the respective magnetic field sensitive device is coupled to one terminal of a magnetic field sensitive device in group N−1 so that the currents forced through (at) the first and second terminals of the corresponding magnetic field device flow through (at) said magnetic field sensitive device in group N−1.

In examples, the supply currents may be provided using a current mirror having a plurality of outputs each output forcing a respective current at one terminal of one of the magnetic field sensitive devices.

In examples, tapping an output voltage at at least one contact of at least one magnetic field sensitive device of each group comprises tapping the output signal between the first and second terminals of the magnetic field sensitive devices.

In examples, independently providing a supply current through each magnetic field sensitive device in group N comprises forcing a current through a first terminal of the corresponding magnetic field sensitive device, and tapping an output voltage comprises tapping an output signal between second terminals of two magnetic field sensitive devices in group N.

In examples, at least some of the magnetic field sensitive devices comprise a magnetic field sensitive element having at least three contacts and a switching array, the method comprising controlling the switching array to selectively couple the at least three contacts and the at least three supply terminals with each other. The switching array may be controlled to selectively couple a first output terminal to one of the three contacts and to selectively couple a second output terminal to one of the three contacts. The switching array may be controlled to change between different switching states defining different couplings between the terminals and the contacts and between the output terminals and the contacts in order to obtain an offset reduction or an offset compensation.

Examples of the present disclosure provide an arrangement of magnetic field sensitive devices with at least three contacts, which comprises: at least one magnetic field sensitive device in a first group (layer), at least two magnetic field sensitive devices in a second group (layer); means to supply at least two of the three magnetic field sensitive devices with electric power; and means to connect the at least two magnetic field sensitive devices in the second group with the at least one magnetic field sensitive device in the first group so that the sum of currents flowing through the at least two magnetic field sensitive devices in the second group flows through the at least one magnetic field sensitive device in the first group. In examples, there is not any permanent ohmic connection between the at least two magnetic field sensitive devices in the second group. At least one of the three magnetic field sensitive devices may be connected to a reference potential. Output signals may be tapped at at least one device of each group and may be combined to give an overall output signal. The largest electrical resistance for the supply current(s) in the first group may be smaller than in the second group. At least one device may have exactly three different contacts which are connected to three different terminals. Means may be provided to selectively connect each contact to each terminal.

Examples of the present disclosure provide an arrangement of magnetic field sensitive devices with at least three contacts, which comprises: an integer number N>1 of groups (layers); one magnetic field sensitive device in the first group; in each group with group number k with 1≤k<N there are half the number of magnetic field sensitive devices as in the group with group number k+1; and means for routing the sum of currents through two magnetic field sensitive devices of group number k+1 through one magnetic field sensitive device of group number k, wherein the internal resistances for the supply current of magnetic field sensitive devices in group number k are smaller than the internal resistances for the supply current of magnetic field sensitive devices in group number k+1, for at least one k.

Examples of the present disclosure provide a novel coupling of magnetic field sensitive devices, which permits interconnection (stacking) and contact commutation of a plurality of magnetic field sensitive devices with tree terminals. Examples provide a funnel arrangement of magnetic field sensitive devices, in which the devices are grouped in several groups or layers (wherein the terms group and layer may be used in an exchangeable manner). Examples may provide a more efficient current flow through the devices when compared to an arrangement in which devices are connected into a ring. Thus, examples may provide for an increased magnetic sensitivity and a reduced residual offset.

In examples, devices in the same group may be regarded as having the same distance from respective end terminals of the supply current paths running through the devices. The term distance means the number of other magnetic field sensitive devices connected between a respective end terminal and the magnetic field sensitive device. As an example, in FIG. 10, the devices in group 3 have a distance of 0 from a first (upper) end terminal and a distance of 2 from a second (lower) end terminal, while the devices in group 2 have a distance of 1 from both end terminals.

In examples, providing supply currents through devices independent from each other means that one or more currents resulting in the respective supply current are impressed (forced) at one or more terminals of the respective device. Thus, the amount of current through each device is defined exactly by the impressed current(s) irrespective of the device. In examples, a separate current source is provided to force (impress) each respective current at the associated terminal.

In examples, the apparatus may include circuitry configured to control the operation of the apparatus, such as the operation of the current sources and the switching arrays, in order to achieve the operations described herein. Moreover, it is clear that the apparatus may include circuitry configured to process the tapped output signals. Alternatively, a separate signal processor for processing the output signals may be provided. Processing the tapped output signals may include at least one of combining output signals tapped at different output terminals and combining output signals tapped during different operation phases. Combining the output signals may include adding, subtracting, averaging, low-pass filtering or integrating the output signals.

As used herein, the term "magnetic field sensitive device" may refer to a single magnetic field sensitive element having contacts, such as at least three contacts. The term "magnetic field sensitive device" may also relate to a composite device including a plurality of magnetic field sensitive elements the contacts of which are wired to each other so that the device has a parallel connection of several magnetic field sensitive elements. Finally, the term "magnetic field sensitive device" may relate to a composite device having the contacts of several magnetic field sensitive elements wired so that the several magnetic field sensitive elements are connected in series, such as a device as shown in FIG. 5. The contacts of the elements of such a composite device may be wired in such a manner, that the composite device has the same number of contacts as the individual elements. For example, terminals $T_1$, $T_2$, $T_3$ of the devices shown in FIGS. 5 and 6 may be regarded as representing the contacts of a corresponding composite device.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, inventive subject matter may lie in less than all features of a single disclosed example. Thus the following claims are hereby incorporated into the Detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

The above described examples are merely illustrative for the principles of the present disclosure. It is understood that modifications and variations of the arrangements and the details described herein will be apparent to others skilled in the art. It is the intent, therefore, to be limited only by the scope of the impending patent claims and not by the specific details presented by way of description and explanation of the examples herein.

What is claimed is:

1. An apparatus, comprising:
 a plurality of magnetic field sensitive devices comprising at least a first magnetic field sensitive device, a second magnetic field sensitive device and a third magnetic field sensitive device; and
 a power supply,
 wherein the first and the second magnetic field sensitive devices are coupled to the third magnetic field sensitive device and to the power supply such that a first supply current path runs through the first magnetic field sensitive device and not through the second magnetic field sensitive device, a second supply current path runs through the second magnetic field sensitive device and not through the first magnetic field sensitive device, and the first and the second current paths run through the third magnetic field sensitive device, and
 wherein an internal resistance of the third magnetic field sensitive device is smaller than both an internal resistance of the first magnetic field sensitive device and an internal resistance of the second magnetic field sensitive device.

2. The apparatus of claim 1, wherein the internal resistance which the third magnetic field sensitive device provides to a third supply current is smaller than the internal resistance which the first magnetic field sensitive device provides to the first supply current and is smaller than the internal resistance which the second magnetic field sensitive device provides to the second supply current.

3. The apparatus of claim 1, wherein the third supply current is a summed current of the first supply current and the second supply current.

4. The apparatus of claim 1, wherein the summed current flows through the third magnetic field sensitive device.

5. The apparatus of claim 1, wherein the plurality of magnetic field sensitive devices are grouped into N groups, with N>1,
 wherein each group k of the N groups comprises $2^{k-1}$ magnetic field sensitive devices, for $1 \leq k \leq N$, wherein k and N are natural numbers and k is an index for a respective group from 1 to N,
 wherein the power source is configured to independently provide a supply current through each magnetic field sensitive device of group N,
 wherein the plurality of magnetic field sensitive devices are coupled such that, for $1 < k \leq N$, supply currents flowing through two magnetic field sensitive devices in group k flow through one magnetic field sensitive device in group k−1.

6. The apparatus of claim 5, wherein an internal resistance which a magnetic field sensitive device of group k provides to the supply current is larger than an internal resistance which a magnetic field sensitive device of group k−1 provides to the supply current, for at least one k with $1 < k \leq N$.

7. The apparatus of claim 6, wherein a magnetic field sensitive device of group k has at least one of:
 a doping concentration smaller than a magnetic field sensitive device of group k−1;
 a spacing between supply terminals larger than in a magnetic field sensitive device of group k−1;
 a width of an active region smaller than a magnetic field sensitive device of group k−1;
 a pn junction for isolating an active region biased with a reverse bias voltage larger than in a magnetic field sensitive device of group k−1; or
 a plurality of magnetic field sensitive elements connected in parallel.

8. The apparatus of claim 5, wherein each of the plurality of magnetic field sensitive devices comprises at least three terminals, wherein, for each of the magnetic field sensitive devices in group N, the power source is configured to force a current at a first terminal of a corresponding magnetic field sensitive device.

9. The apparatus of claim 8, wherein an output signal is tapped at at least one terminal of at least one magnetic field sensitive device of each group k of the N groups and to combine each tapped output signal into an overall output signal.

10. The apparatus of claim 8, wherein, for $1 \leq k < N$ and for each magnetic field sensitive device in group k, the first terminal is coupled to a third terminal of a magnetic field sensitive device in group k+1, a second terminal is coupled to a third terminal of another magnetic field sensitive device in group k+1, and for $k \neq 1$, a third terminal is coupled to a terminal of a magnetic field sensitive device in group k−1.

11. The apparatus of claim 8, wherein, for at least one of the magnetic field sensitive devices in group N, the power source is configured to force a current at a second terminal of the corresponding magnetic field sensitive device, wherein a third terminal of the corresponding magnetic field sensitive device is coupled to the first terminal of a magnetic field sensitive device in group N−1.

* * * * *